US007188049B2

(12) United States Patent
Tsuchiya et al.

(10) Patent No.: US 7,188,049 B2
(45) Date of Patent: Mar. 6, 2007

(54) SYSTEM AND METHOD FOR CONTROLLING MANUFACTURING PROCESSES, AND METHOD FOR MANUFACTURING A SEMICONDUCTOR DEVICE

(75) Inventors: Norihiko Tsuchiya, Tokyo (JP); Yukihiro Ushiku, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 11/086,220

(22) Filed: Mar. 23, 2005

(65) Prior Publication Data
US 2005/0233601 A1    Oct. 20, 2005

(30) Foreign Application Priority Data
Mar. 23, 2004   (JP)   ............... 2004-084682

(51) Int. Cl.
*G06F 15/00* (2006.01)
(52) U.S. Cl. ...................... 702/182; 250/306
(58) Field of Classification Search ............ 702/42, 702/132, 133, 136, 138, 140, 150, 153, 158, 702/167, 179, 182–185; 250/306, 307, 310, 250/311
See application file for complete search history.

(56) References Cited
U.S. PATENT DOCUMENTS
2003/0168596 A1* 9/2003 Sasajima et al. ............ 250/310

OTHER PUBLICATIONS

Schwarz; "Simulation of Dislocations on the Mesoscopic Scale. I. Methods and Examples"; Journal of Applied Physics, vol. 85, No. 1, pp. 108-119, (1999).

* cited by examiner

*Primary Examiner*—Hal Wachsman
*Assistant Examiner*—Mohamed Charioui
(74) *Attorney, Agent, or Firm*—Finnegan, Henderson, Farabow, Garrett & Dunner, L.L.P.

(57) ABSTRACT

A control system for a manufacturing process includes an inspection tool inspecting a dislocation image in semiconductor substrate processed by manufacturing processes; an inspection information input module configured to acquire the inspected dislocation image; a process condition input module acquiring process conditions of the manufacturing processes; a structure information input module acquiring structure of the semiconductor substrate processed by target manufacturing process; a stress analysis module calculating stresses at nodes provided in the structure, based on target process condition and the structure; an origin setting module providing origins at positions where stress concentration having stress value not less than reference value is predicted; a dislocation dynamics analysis module calculating dislocation pattern in stress field for each position of the origins; and a dislocation pattern comparison module comparing the dislocation pattern with the inspected dislocation image so as to determine whether the target manufacturing process is critical manufacturing process.

20 Claims, 13 Drawing Sheets

SYSTEM AND METHOD FOR CONTROLLING MANUFACTURING PROCESSES, AND METHOD FOR MANUFACTURING A SEMICONDUCTOR DEVICE

CROSS REFERENCE TO RELATED APPLICATIONS AND INCORPORATION BY REFERENCE

This application is based upon and claims the benefit of priority from prior Japanese Patent Application P2004-084682 stored on Mar. 23, 2004; the entire contents of which are incorporated by reference herein.

BACKGROUND OF THE INVENTION

1. Field of the Invention

The present invention relates to an improvement of a manufacturing process for a semiconductor device. More particularly, it relates to a control system for a plurality of manufacturing processes and a method for controlling a sequence of manufacturing processes. The control system is capable of suppressing crystal defects in the manufacturing processes for a semiconductor integrated circuit.

2. Description of the Related Art

In a sequence of manufacturing processes of a semiconductor device such as a large scale integrated circuit (LSI), generation of a dislocation of a process-induced crystal defect causes problem with the electrical characteristics of the LSI such as leakage current in a pn junction. Accordingly, the product yield rate is significantly decreased. Particularly, a semiconductor substrate has grown in size to have a diameter of 300 mm. Thus, manufacturing costs of the semiconductor device have increased. Once an electrical characteristic failure occurs in a semiconductor device of a product lot, an attempt is made to identify the failure, and measures to prevent the cause of the failure are investigated. Currently, in order to search for the cause of the failure, a plurality of prototype lots are manufactured by changing process conditions in trial facilities, and an electrical characteristic, stress simulation and the like, are evaluated for a semiconductor device of each prototype lot. By referring to the evaluation results of the semiconductor devices, the reason for generation of a dislocation is identified. Then, measures to prevent the reason for generation of the dislocation can be taken. However, the current stress simulation provides only a distribution of stress and distortion. Thus, it is very ambiguous whether a dislocation actually occurs, since growth of the dislocation is separately determined. Therefore, in the current situation, enormous stress simulation results are hardly ever used in searching for a cause of dislocation generation.

As to evaluation of a dislocation in a semiconductor device, a dislocation dynamics simulation has been proposed which deals with dislocation motion and an interaction between dislocations in a three-dimensional stress field based on dislocation dynamics (see K. W. Schwarz, J. Appl. Phys., January 1999, Vol. 85, No. 1, p. 108). Although the dislocation dynamics simulation has a large potential, cases dealing with the dislocation dynamics simulation are limited to a behavior of a dislocation in a relatively simple dislocation pattern. Therefore, the dislocation dynamics simulation has not yet been established as an effective means for investigating a cause of dislocation generated in the semiconductor device.

Moreover, in order to search for a cause of a failure, evaluation of a semiconductor device manufactured for a prototype, under a number of process conditions, is time-consuming. Since the manufacture of product lots is continued during a search for a cause of a failure, a number of product lots will be wasted before a measure or a preventive measure to cure the cause of the failure is taken. Therefore, the yield rate for a semiconductor device drastically decreases, and the manufacturing costs increase.

SUMMARY OF THE INVENTION

A first aspect of the present invention inheres in a control system for a manufacturing process, including: an inspection tool configured to inspect a dislocation image of a dislocation generated in a semiconductor substrate processed by a plurality of manufacturing processes; an inspection information input module configured to acquire the inspected dislocation image; a process condition input module configured to acquire a plurality of process conditions of the manufacturing processes; a structure information input module configured to acquire a structure of the semiconductor substrate processed by a target manufacturing process; a stress analysis module configured to calculate stresses at a plurality of nodes provided in the structure, based on a target process condition of the target manufacturing process and the structure; an origin setting module configured to provide a plurality of origins at positions where a stress concentration having a stress value not less than a reference value is predicted; a dislocation dynamics analysis module configured to calculate a dislocation pattern of an analysis dislocation line in a stress field by the stresses for each position of the origins; and a dislocation pattern comparison module configured to compare the dislocation pattern of the analysis dislocation line with the inspected dislocation image so as to determine whether the target manufacturing process is a critical manufacturing process that generates the dislocation.

A second aspect of the present invention inheres in a computer implemented method for controlling a manufacturing process, including: inspecting a dislocation image of a dislocation in a semiconductor substrate processed by a plurality of manufacturing processes; acquiring a plurality of process conditions of the manufacturing processes; acquiring a structure of the semiconductor substrate processed by a target manufacturing process; calculating stresses at a plurality of nodes provided in the structure based on a target process condition of the target manufacturing process and the structure; providing a plurality of origins at positions where a stress concentration having a stress value not less than a reference value is predicted; calculating a growth process of an analysis dislocation line in a stress field by the stresses for each position of the origins so as to predict a dislocation pattern of the analysis dislocation line; and comparing the dislocation pattern of the analysis dislocation line with the inspected dislocation image so as to determine whether the target process is a critical manufacturing process that generates the dislocation.

A third aspect of the present invention inheres in a method for manufacturing a semiconductor device, including: performing a plurality of manufacturing processes on a semiconductor substrate; inspecting a dislocation image of a dislocation in the semiconductor substrate; creating a corrected target process condition by processing includes: acquiring the inspected dislocation image; acquiring a plurality of process conditions of the manufacturing processes; acquiring a structure of the semiconductor substrate processed by a target manufacturing process; calculating stresses at a plurality of nodes provided in the structure based on a target process condition of the target manufacturing process and the structure; providing a plurality of origins at positions where a stress concentration having a stress value not less than a reference value is predicted; calculating a dislocation pattern of an analysis dislocation line in a stress field by the stresses for each position of the origins; comparing the dislocation pattern of the analysis dislocation line with the inspected dislocation image so as to determine whether the target process is a critical manufacturing process that generates the dislocation in the semiconductor substrate; selecting a target structure parameter from among a plurality of structure parameters, the structure parameters specifying the structure processed by the critical manufacturing process; and predicting a critical value of the target structure parameter which causes a failure based on a second dislocation pattern of a second analysis dislocation line provided by varying a value of the target structure parameter, so as to correct a critical process condition of the critical manufacturing process; and performing the target manufacturing process on another semiconductor substrate by the corrected target process condition.

DETAILED DESCRIPTION OF THE INVENTION

Figure 1:
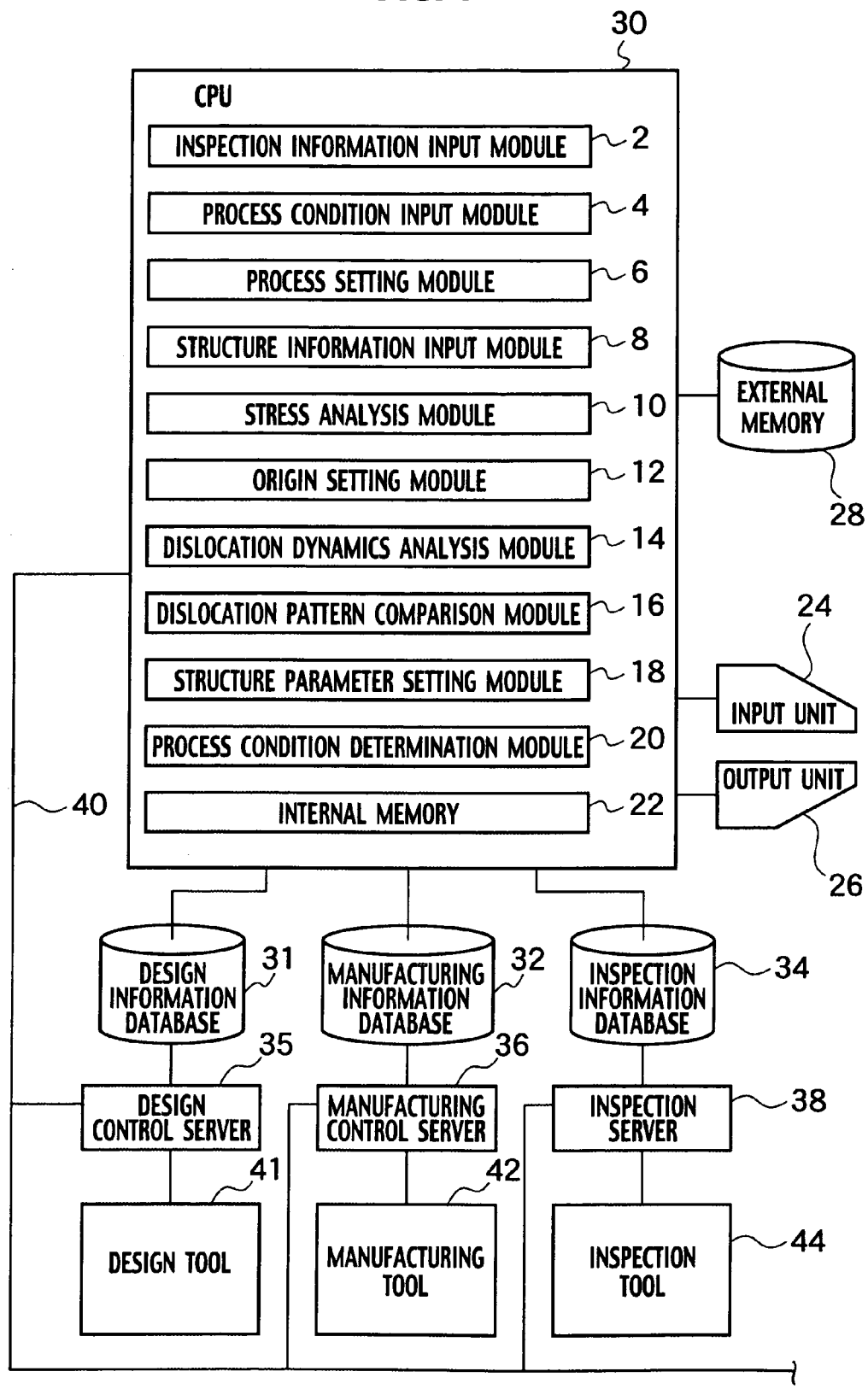
FIG. 1 is a block diagram showing an example of configuration of a control system for a manufacturing process according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a control system for a manufacturing process according to an embodiment of the present invention includes a design information database 31, a manufacturing information database 32, an inspection information database 34, a central processing unit (CPU) 30, and the like. The design information database 31 is connected to a design control server 35 which controls a design tool 41. The manufacturing information database 32 is connected to a manufacturing control server 36 which provides a control operation to a manufacturing tool 42. The inspection information database 34 is connected to an inspection server 38 which provides a control operation to an inspection tool 44. The CPU 30, the design control server 35, the manufacturing control server 36, the inspection server 38, and the like are connected to each other through a communication network 40 such as a local area network (LAN). Moreover, an input unit 24, an output unit 26 and an external memory 28 are connected to the CPU 30. Furthermore, the CPU 30 includes an inspection information input module 2, a process condition input module 4, a process setting module 6, a structure information input module 8, a stress analysis module 10, an origin setting module 12, a dislocation dynamics analysis module 14, a dislocation pattern comparison module 16, a structure parameter setting module 18, a process condition determination module 20, an internal memory 22, and the like.

The design tool 41 includes a computer-aided design (CAD) system, a pattern generator (PG) and the like, which design and prepare a layout of a circuit and a photomask, and the like, of a semiconductor device. A specification for the circuit of the semiconductor device and a circuit layout pattern, which are designed by the CAD system, are stored in the design information database 31 by the design control server 35. Moreover, based on the designed layout pattern of the semiconductor device, a plurality of photomasks for manufacturing the semiconductor device are prepared by the PG in the design tool 41 or by an external mask maker.

In the manufacturing tool 42, manufacturing facilities for a semiconductor device include various manufacturing apparatuses. The manufacturing apparatuses include, for example, a chemical vapor deposition (CVD) apparatus, an oxidation apparatus, an annealing apparatus, an exposure tool, a developer, an etcher, an evaporator, and the like. The respective manufacturing apparatuses execute various manufacturing processes of a semiconductor device based on process conditions acquired from the manufacturing control server 36.

In the embodiment of the present invention, a semiconductor device with a 90 nm design rule having a shallow trench isolation (STI), for example, a semiconductor memory, is manufactured by the manufacturing tool 42. For simplification of the description, with reference to FIGS. 2 to 10, a trial manufacturing process of an n-channel metaloxide-semiconductor (MOS) transistor of a memory cell in the semiconductor memory will be described as an example of a manufacturing process to be improved.

Figure 2:
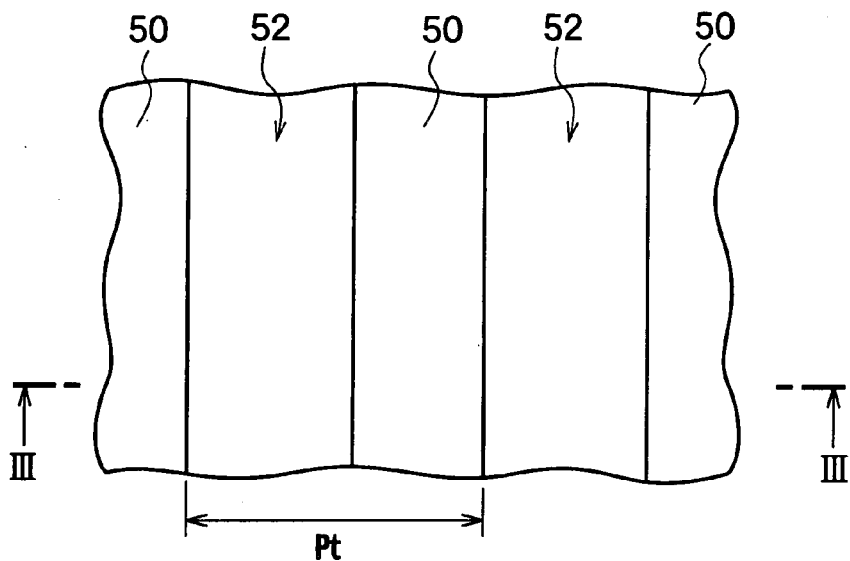
FIG. 2 is a plan view (No. 1) showing an example of a manufacturing process of a semiconductor device, which is used for explaining the embodiment of the present invention.
Figure 3:
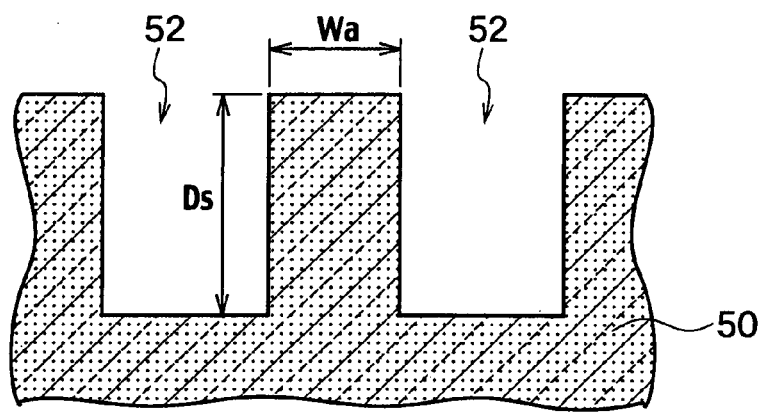
FIG. 3 is a cross-sectional view taken along the line III—III in a semiconductor substrate shown in FIG. 2.

As shown in FIGS. 2 and 3, trenches 52 are formed at a predetermined pitch Pt in a p-type semiconductor substrate 50, for example, by a photolithography process and a dry etching process such as reactive ion etching (RIE). For example, a depth Ds of the trench 52 is about 250 nm, and a width Wa of the semiconductor substrate 50 remaining between adjacent trenches 52 is about 100 nm.

Figure 4:
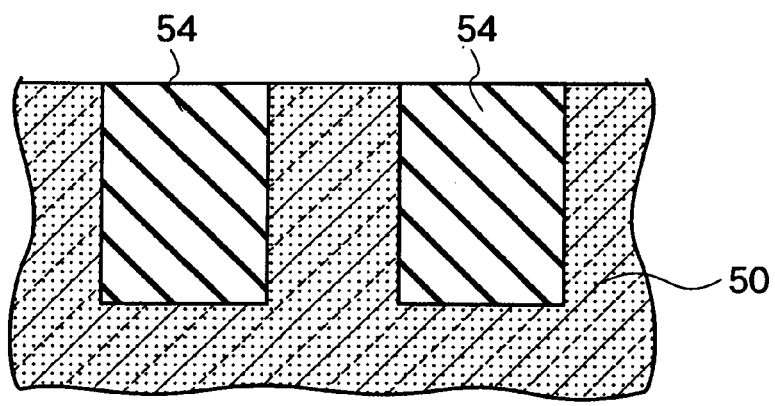
FIG. 4 is a cross-sectional process view (No. 2) showing an example of the manufacturing process of a semiconductor device, which is used for explaining the embodiment of the present invention.

In an insulating film CVD process, an insulating film such as a silicon oxide ($SiO_2$) film is deposited on a surface of the semiconductor substrate 50 so as to fill up the trenches 52. A temperature for the insulating film CVD is, for example, about 500° C. to about 700° C. As shown in FIG. 4, an unnecessary insulating film deposited on the surface of the semiconductor substrate 50 is removed in a chemical mechanical polishing (CMP) process. As a result, the insulating film buried in the trenches 52 is planarized to form STIs 54. Thereafter, the STIs 54 are densified in a STI annealing process. A temperature for the STI annealing is selected in a range of about 800° C. to about 1100° C. After the formation of the STIs 54, p-type wells are formed in the p-type semiconductor substrate 50 between the STIs 54.

Figure 5:
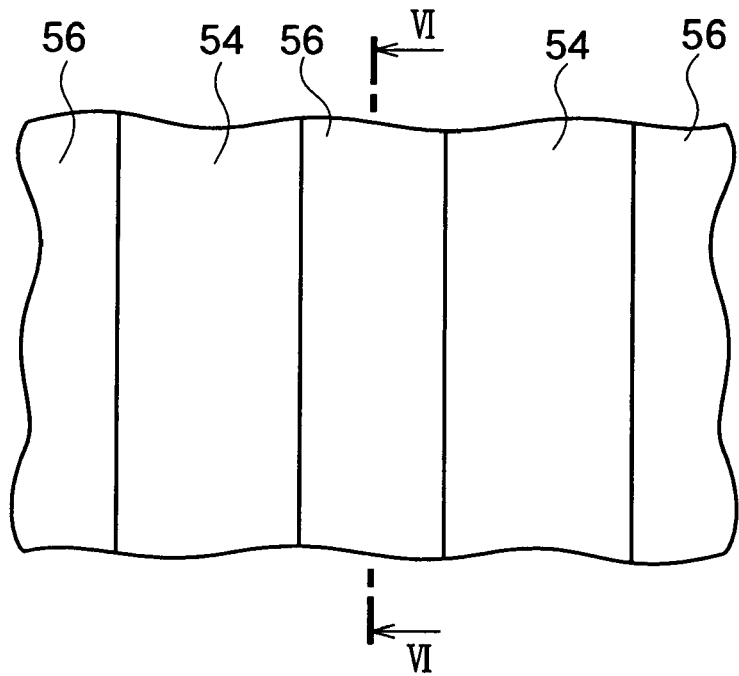
FIG. 5 is a plan view (No. 3) showing an example of the manufacturing process of a semiconductor device, which is used for explaining the embodiment of the present invention.
Figure 6:
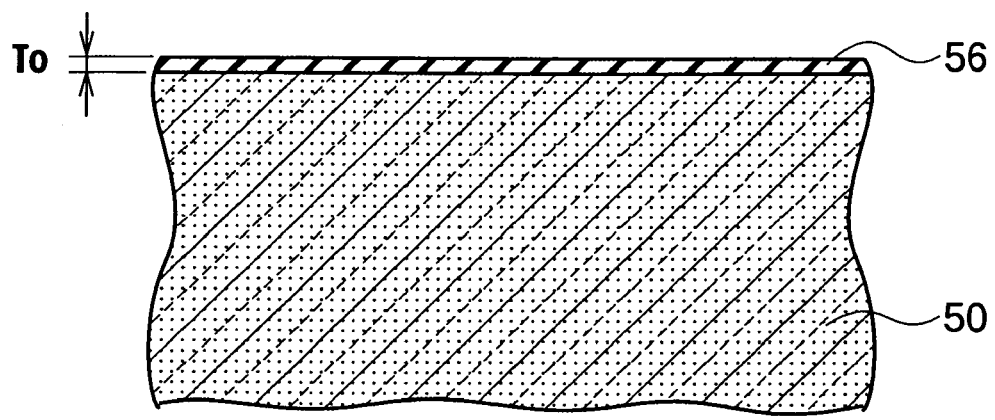
FIG. 6 is a cross-sectional view taken along the line VI—VI in the semiconductor substrate shown in FIG. 5.

As shown in FIGS. 5 and 6, in a gate thermal oxidation process, an insulating film 56 is formed on the surface of the semiconductor substrate 50 exposed between the STIs 54. A temperature for the gate thermal oxidation is, for example, about 700° C. to about 1100° C. A film thickness To of the insulating film 56 is, for example, about 20 nm.

Figure 7:
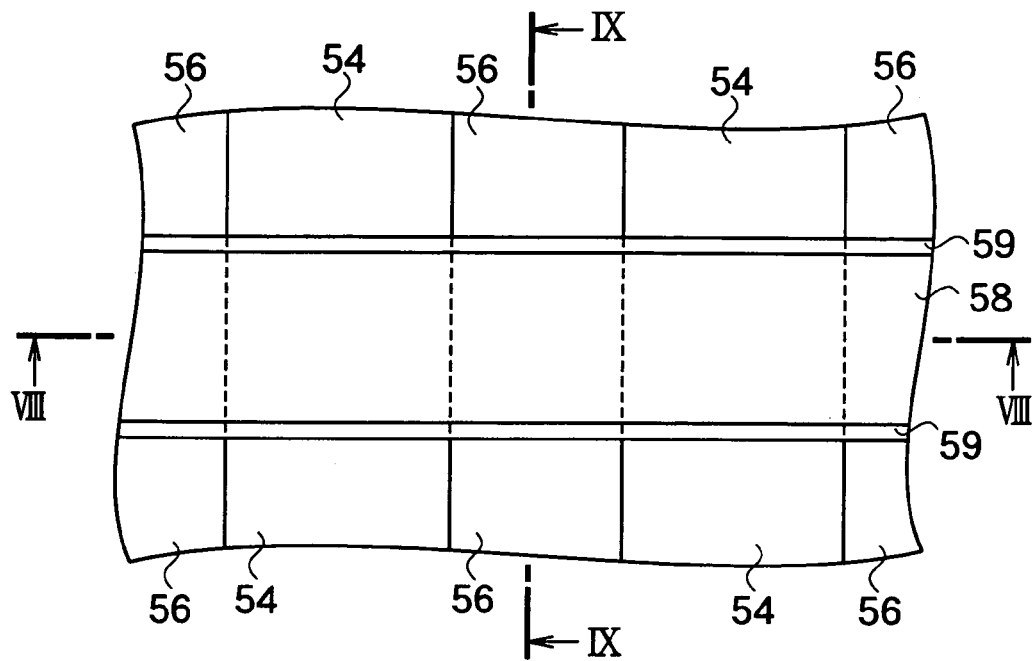
FIG. 7 is a plan view (No. 4) showing an example of the manufacturing process of a semiconductor device, which is used for explaining the embodiment of the present invention.
Figure 8:
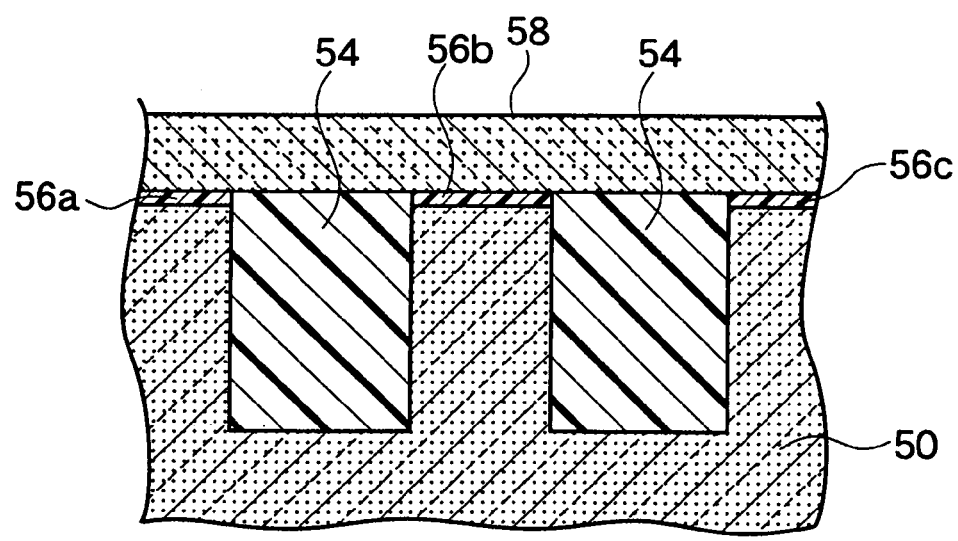
FIG. 8 is a cross-sectional view taken along the line VIII—VIII in the semiconductor substrate shown in FIG. 7.
Figure 9:
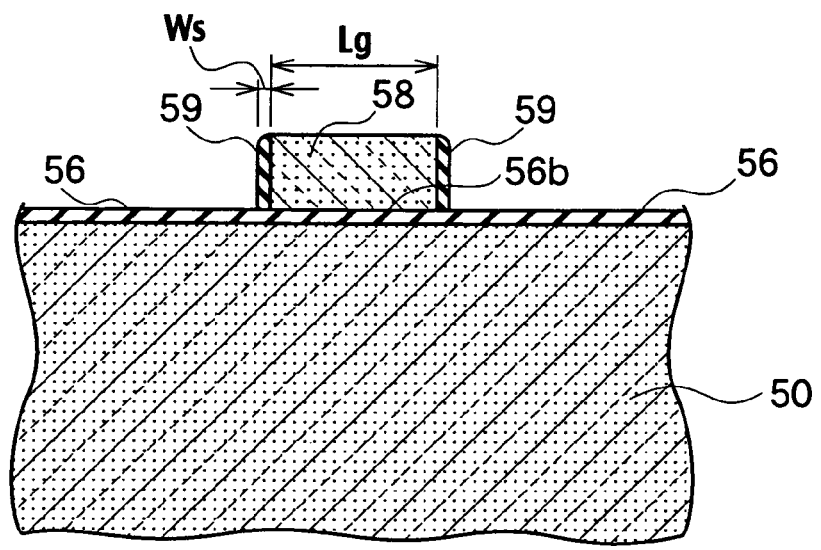
FIG. 9 is a cross-sectional view taken along the line IX—IX in the semiconductor substrate shown in FIG. 7.

In a polycrystalline silicon (poly-Si) CVD process, a poly-Si film is deposited on the semiconductor substrate 50 having the insulating film 56 formed thereon. A temperature for the poly-Si CVD is, for example, about 500° C. to about 800° C. In the photolithography process and the dry etching process, gate electrodes are formed so as to extend in a stripe shape on the insulating film 56 and the STIs 54. Thereafter, the gate electrodes are oxidized in a poly-Si thermal oxidation process. A temperature of the poly-Si thermal oxidation is, for example, about 700° C. to about 1100° C. Subsequently, as shown in FIG. 7, sidewall spacers 59 are formed on the gate electrode 58 in an etch-back process. As shown in FIGS. 8 and 9, portions of the insulating film 56 immediately below the gate electrode 58 are provided as gate insulating films 56a to 56c. A gate length Lg of the gate electrode 58 is, for example, about 90 nm. Moreover, a width Ws of the sidewall spacer 59 is about 20 nm.

Figure 10:
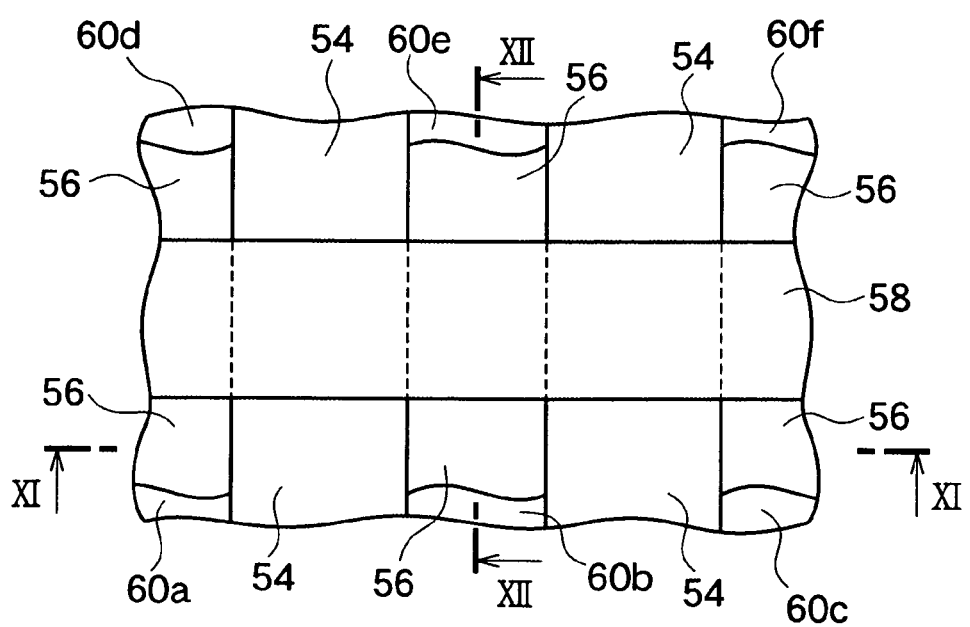
FIG. 10 is a plan view (No. 5) showing an example of the manufacturing process of a semiconductor device, which is used for explaining the embodiment of the present invention.
Figure 11:
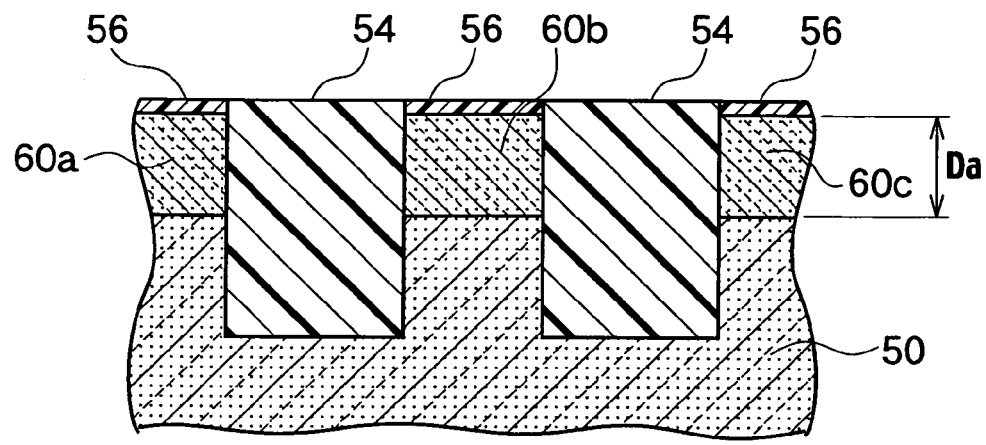
FIG. 11 is a cross-sectional view taken along the line XI—XI in the semiconductor substrate shown in FIG. 10.
Figure 12:
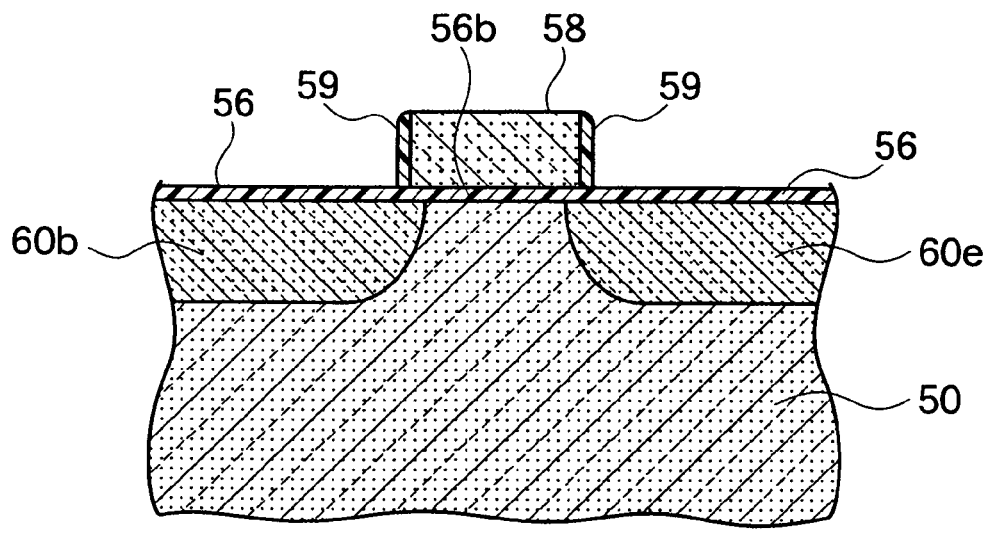
FIG. 12 is a cross-sectional view taken along the line XII—XII in the semiconductor substrate shown in FIG. 10.

In an ion implantation process, impurity ions of group V elements such as phosphor (P) and arsenic (As) are implanted in the vicinity of the surface of the semiconductor substrate 50 through the insulating film 56 by use of the gate electrode 58 and the sidewall spacers 59 as a mask. As shown in FIGS. 10 and 11, in an activation annealing process executed after the ion implantation process, the implanted impurity ions are activated to form n+ type active regions 60a to 60f. A temperature of the activation annealing is, for example, about 800 to about 1100° C. The impurity ions are diffused by the activation annealing so as to form each of the active regions 60a to 60f with a depth Da, for example, of about 120 nm. Moreover, the impurity ions are diffused also in a lateral direction. As shown in FIG. 12, for example, ends of the active regions in the lateral direction of the respective active regions 60b and 60e face each other across the gate electrode 58 and extend to the sidewall spacers 59 under the gate insulating film 56b in the vicinity of a boundary with the gate electrode 58. Thus, $n^+p$ junctions are formed. Furthermore, an interlevel insulating film process, a wiring process and the like are performed for the n-channel MOS transistor manufactured for the prototype.

Note that, in the case where a p-channel MOS transistor is manufactured, n-type wells are formed in the p-type semiconductor substrate 50 between the STIs 54 after the formation of the STIs 54 shown in FIG. 4. Furthermore, active regions 60a to 60f shown in FIGS. 10 and 11 are $p^+$ type active layers formed by ion implantation of impurity ions of group III elements such as boron (B) and execution of the activation annealing process. By executing manufacturing processes as with the n-channel MOS transistor, $p^+n$ junctions are formed.

As described above, in the manufacturing tool 42 shown in FIG. 1, the semiconductor device is manufactured for prototypes through a plurality of manufacturing processes. Process conditions of the respective manufacturing processes of the semiconductor device, and structure information of structure parameters such as a size and a shape which specify a structure of an element such as a MOS transistor included in the semiconductor device formed on the semiconductor substrate 50 are provided as manufacturing information by the manufacturing control server 36. The manufacturing control server 36 stores the manufacturing information on the prototype semiconductor device in the manufacturing information database 32.

The inspection tool 44 includes various inspection apparatuses for inspecting and measuring the processed semiconductor substrate 50 after the respective processes of manufacturing the semiconductor device are finished. The inspection apparatuses include an optical microscope for surface observation, a transmission electron microscope (TEM) for structural analysis, a scanning electron microscope (SEM) for surface observation and structural analysis, a tester for measuring electrical characteristics, and the like. The tester provided in the inspection tool 44 shown in FIG. 1 measures electrical characteristics of the semiconductor device manufactured for the prototype in the manufacturing tool 42. For a defective semiconductor device, in which a failure of an electrical characteristic is detected, a cause of the failure is analyzed by measurements obtained from the TEM, for example.

For example, in the MOS transistor manufactured for a prototype through the processes shown in FIGS. 2 to 12, a failure caused by a leakage current in an $n^+p$ junction between the active regions 60a to 60f and the semiconductor substrate 50 is detected by measurement of an electrical characteristic by the tester. In the vicinity of the $n^+p$ junction between the active regions 60a to 60f and the semiconductor substrate 50, a defect such as a dislocation is measured by use of a TEM. Inspection results such as a failure of an electrical characteristic and a dislocation image, which are measured by the tester, the TEM and the like, are acquired by the inspection server 38 as inspection information. The inspection server 38 stores the inspection information of the defective semiconductor device manufactured for a prototype in the inspection information database 34.

The inspection information input module 2 in the CPU 30 shown in FIG. 1 acquires an inspected dislocation image from the inspection information database 34, which is measured from the MOS transistor having an electrical characteristic failure manufactured by the processes shown in FIGS. 2 to 12, for example. The process condition input module 4 acquires process conditions of the respective processes from the manufacturing information database 32. The process setting module 6 selects a candidate for a critical process which causes dislocation generation, from among the plurality of processes, based on the acquired process conditions. For example, a process including heat treatment is selected as a target process for dislocation generation analysis. As the process including heat treatment, for example, the insulating film CVD process, the STI annealing process, the gate thermal oxidation process, the poly-Si CVD process, the poly-Si thermal oxidation process, the activation annealing process, and the like are cited. The structure information input module 8 acquires structure information such as structure parameters which provide a structure of the semiconductor substrate 50 processed by the target process, from the manufacturing information database 32. The structure parameters of the structure information include, for example, the width Wa of the semiconductor substrate 50 between adjacent STIs 54, the depth Ds of the trenches, the film thickness To of the gate insulating films 56a to 56c, the gate length Lg of the gate electrode 58, and the depth Da of the active regions 60a to 60f. Moreover, the structure parameters also include a shape of the gate electrode 58, and the like.

Figure 13:
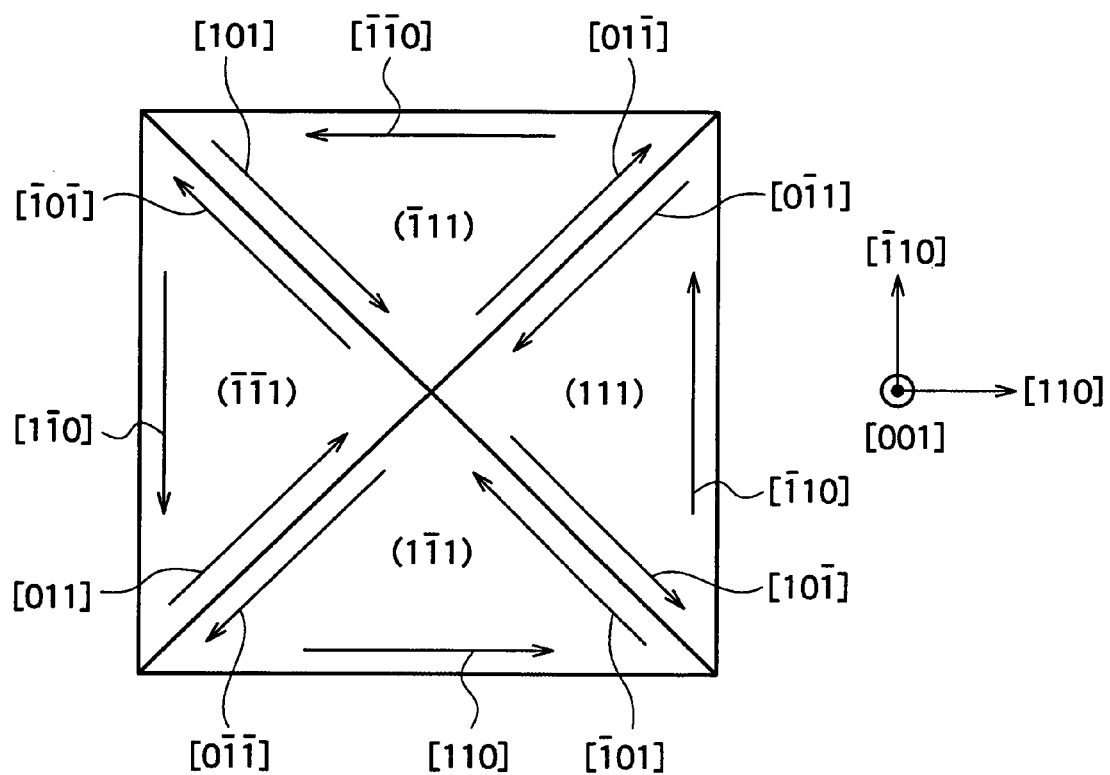
FIG. 13 is a view for explaining twelve kinds of slip systems in a silicon semiconductor crystal, which is used for explaining a stress analysis according to the embodiment of the present invention.

Based on the process conditions and the structure parameters, the stress analysis module 10 re-creates a basic structure of a MOS transistor in a memory cell formed by each target process. For a semiconductor crystal such as Si in the re-created structure, a three-dimensional stress simulation by a finite element method is implemented. In the finite element method, rough meshing is provided in a region with no change in shape, and fine meshing is provided in a region with a change in shape. Thus, stresses are calculated at respective meshing nodes. By interpolating additional nodes between the respective unequally spaced nodes, a stress field is provided with equal spacing in the semiconductor crystal to be simulated. Moreover, as shown in FIG. 13, each stress at the equally spaced nodes is converted to a shearing stress in twelve kinds of slip systems defined by three kinds of <110> directions which are slip directions indicated by the arrows in FIG. 13, in each of four kinds of {111} planes which are slip planes of the Si semiconductor crystal. Note that FIG. 13 is a view of an octahedron including side surfaces formed by {111} planes, from the [001] direction. From the stress field calculated as described above, stress concentration of 100 MPa or more is confirmed at upper ends and lower ends of the semiconductor substrate 50 in contact with the STIs 54, or on surfaces of the active regions 60a to 60f immediately below end portions of the gate electrode 58, for example.

Figure 14:
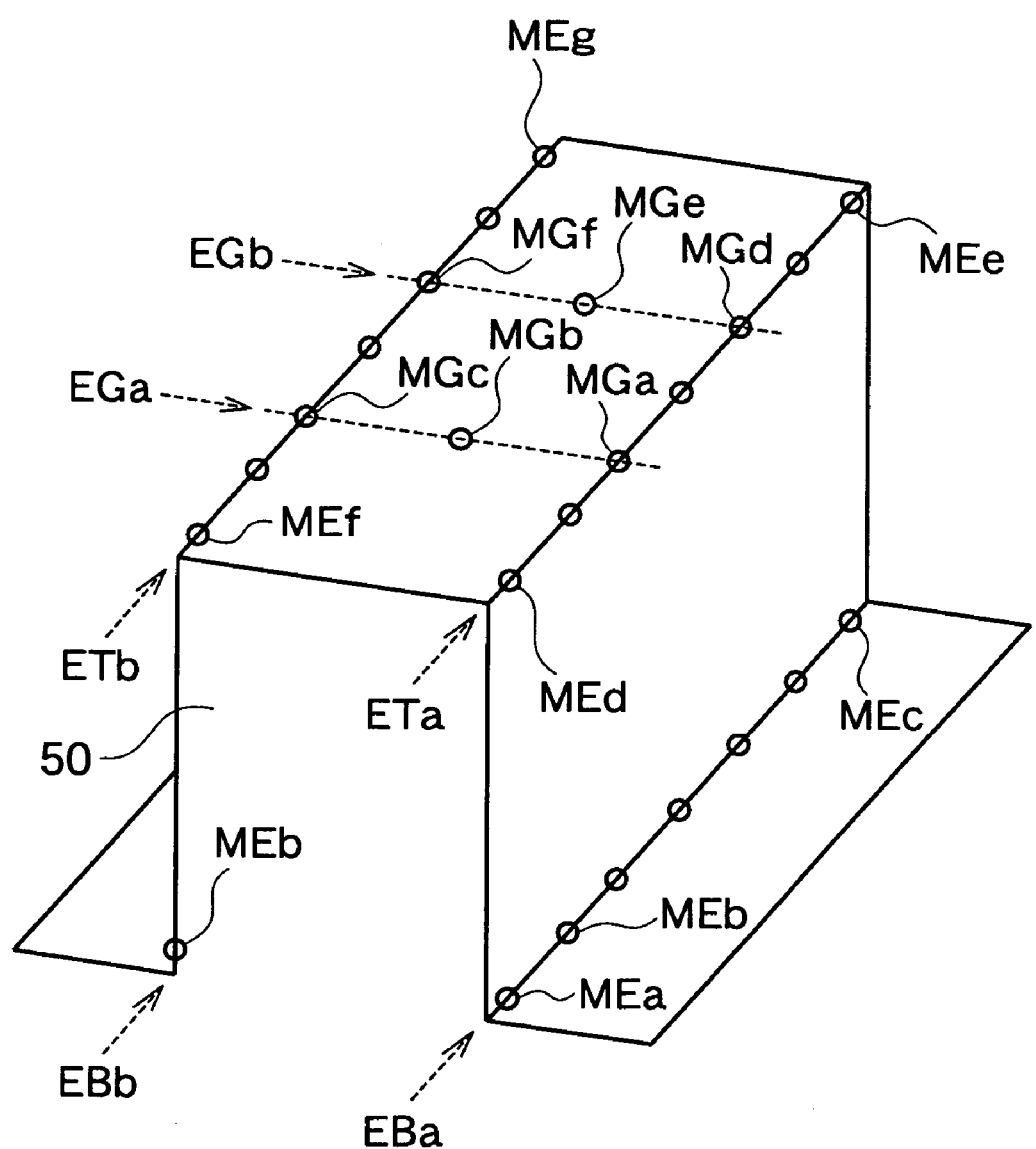
FIG. 14 is a view showing an example of candidates of origins set on the semiconductor substrate, which is used for explaining the embodiment of the present invention.

The origin setting module 12 automatically sets origins at positions on the surface of the semiconductor substrate 50 where the stress concentration of not less than a reference value is confirmed, by calculation. As the reference value of the stress, for example, 100 MPa is selected. Therefore, at the lower ends EBa and EBb of the semiconductor substrate 50, as shown in FIG. 14, origins MEa, MEb, . . . , MEc, and MEh, . . . are provided, respectively. At the upper ends ETa and ETb, origins MEd, . . . , MEe, and MEf, . . . , MEg are provided, respectively. Moreover, at positions EGa and EGb corresponding to the end portions of the gate electrode 58, which are indicated by the dotted lines, origins MGa to MGc and MGd to MGf are provided, respectively. The respective origins MEa to MEh and MGa to MGf are arranged, for example, at a spacing of about 50 nm. Note that the origins may be arranged at an arbitrary spacing.

For the respective origins MEa to MEh and MGa to MGf provided by the origin setting module 12, the dislocation dynamics analysis module 14 performs a dislocation dynamics simulation in the stress field calculated by the stress analysis module 10. In the dislocation dynamics simulation, a growth process of a dislocation line is calculated at the respective origins MEa to MEh and MGa to MGf by use of a dislocation loop with a diameter of 15 nm, for example, as a source of dislocation within the stress field. In the dislocation dynamics simulation, the dislocation line is divided into segments so as to calculate a force acting on the dislocation relative to each of the segments according to the following Peach-Koehler formula.

$$f = \sigma * b \times t \qquad (1)$$

Here, f, σ, b, and t are a vector of a force acting on the segments, a stress tensor, a Burgers vector existing on a slip plane, and a direction vector of the segments of the dislocation line, respectively. The operation symbols of "∗" and "×" represent the scalar product and the vector product, respectively. The formula (1) is the vector product of the Burgers vector b and the direction vector t of the segments of the dislocation line. Thus, a direction of the force acting on the dislocation is always perpendicular to the dislocation line.

Figure 15:
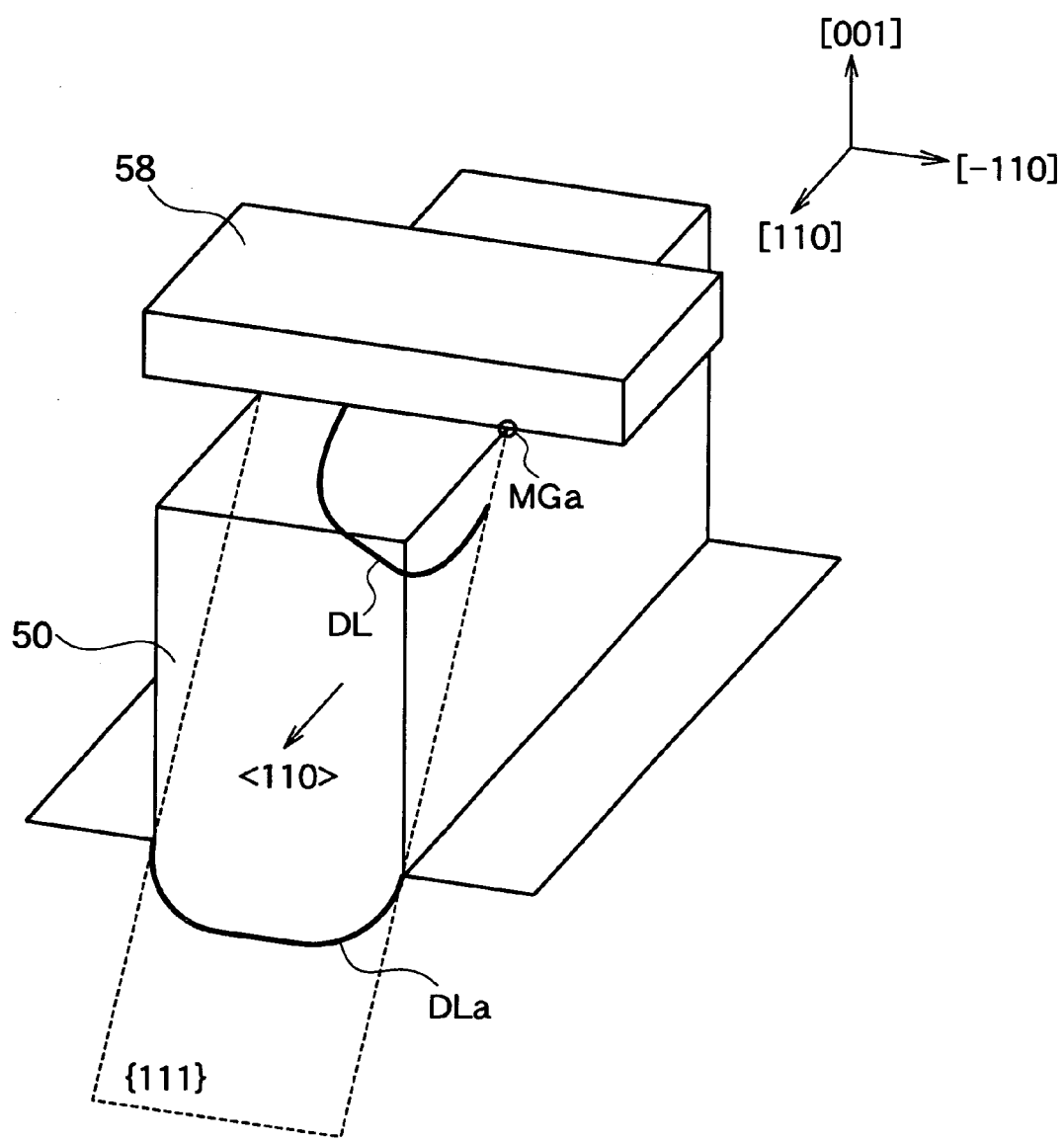
FIG. 15 is a view showing an example of a process of dislocation growth, which is used for explaining dislocation dynamics analysis according to the embodiment of the present invention.

With the results of calculation of the dislocation dynamics simulation, the output unit 26 shown in FIG. 1, for example, displays, on a screen, how the dislocation extends in the entire slip system. From the calculation result, growth of the dislocation line is confirmed in the poly-Si thermal oxidation process. For example, as shown in FIG. 15, a dislocation source provided at the origin MGa where the top end of the semiconductor substrate 50 intersects with the end of the gate electrode 58, grows on the {111} plane with a semielliptic dislocation line DL along the end of the gate electrode 58 at the beginning of the growth of the dislocation. Thereafter, both ends of the semielliptic dislocation line DL gradually grow on the {111} plane while slipping down sidewalls on both sides of the semiconductor substrate 50. Finally, an analysis dislocation line DLa is stabilized so as to terminate at the bottom ends of the semiconductor substrate 50 where the stress is concentrated. Note that, in FIG. 15, for simplification of the description, the STI 54, the insulating film 56, the sidewall spacer 59, and the like are not shown.

The dislocation pattern comparison module 16 compares a dislocation pattern of the analysis dislocation line DLa calculated by the dislocation dynamics analysis module 14 with the inspected dislocation image acquired by the inspection information input module 2, so as to determine a manufacturing process in which the dislocation is generated. If end positions and dislocation lengths of the analysis dislocation line DLa and the inspected dislocation image correspond with each other within a range of a determination reference value previously set in the dislocation pattern comparison module 16, the analysis dislocation line DLa is determined to correspond to the inspected dislocation image. In the embodiment of the present invention, the analysis dislocation line DLa shown in FIG. 15 is confirmed to have the end position at the bottom end of the semiconductor substrate 50 the same as the inspected dislocation image. In addition, the dislocation length of the analysis dislocation line DLa is confirmed to correspond with the inspected dislocation image within the determination reference value of about 30%.

As a result, the poly-Si thermal oxidation process is specified as the critical process which causes dislocation generation. Moreover, the origin MGa at the position where the top end of the semiconductor substrate 50 intersects with the gate electrode 58 is specified as a critical dislocation origin.

The structure parameter setting module 18 selects a target structure parameter from the plurality of structure parameters of the semiconductor substrate 50 processed by the critical process specified by the dislocation pattern comparison module 16. For example, if the gate electrode thermal oxidation process is specified as the critical process by the dislocation pattern comparison module 16, the target structure parameter is provided from the width Ws of the sidewall spacer 59 and the gate length Lg of the gate electrode 58 shown in FIG. 9, the film thickness To of the insulating film 56 to be the gate insulating films 56a to 56c shown in FIG. 6, the width Wa of the semiconductor substrate 50 and the depth Ds of the trench 52 shown in FIG. 3, and the like.

The structure parameter setting module 18 varies a value of the target structure parameter within a predetermined range. The stress analysis module 10 obtains the value of the target structure parameter from the structure parameter setting module 18 so as to predict a stress field. For the predicted stress field, the origin setting module 12 provides the plurality of origins as shown in FIG. 14, for example. At each of the plurality of origins, growth process of dislocation is predicted by the dislocation dynamics analysis module 14. As described above, a stress analysis and a dislocation dynamics analysis are repeated. As a result, if the film thickness To of the insulating film 56 shown in FIG. 6 is provided as the target structure parameter, it is confirmed that a dislocation pattern calculated by the dislocation dynamics analysis changes.

Figure 16:
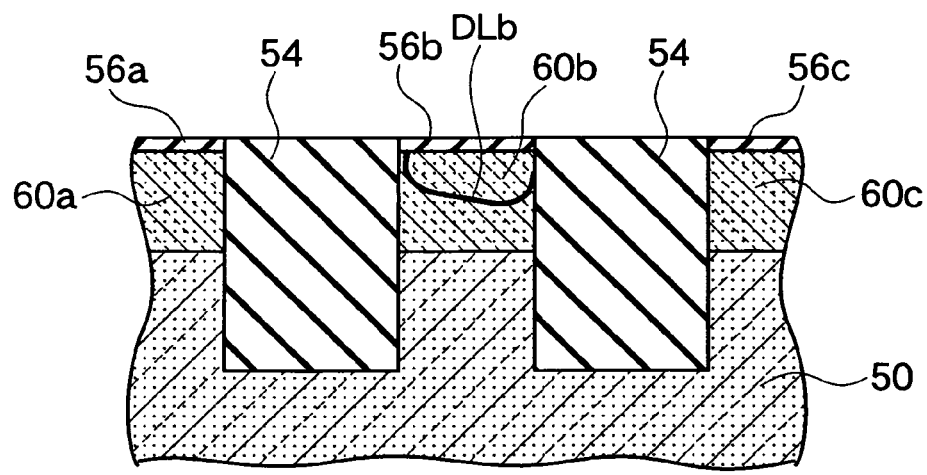
FIG. 16 is a view showing another example of a dislocation line, which is used for explaining the embodiment of the present invention.
Figure 17:
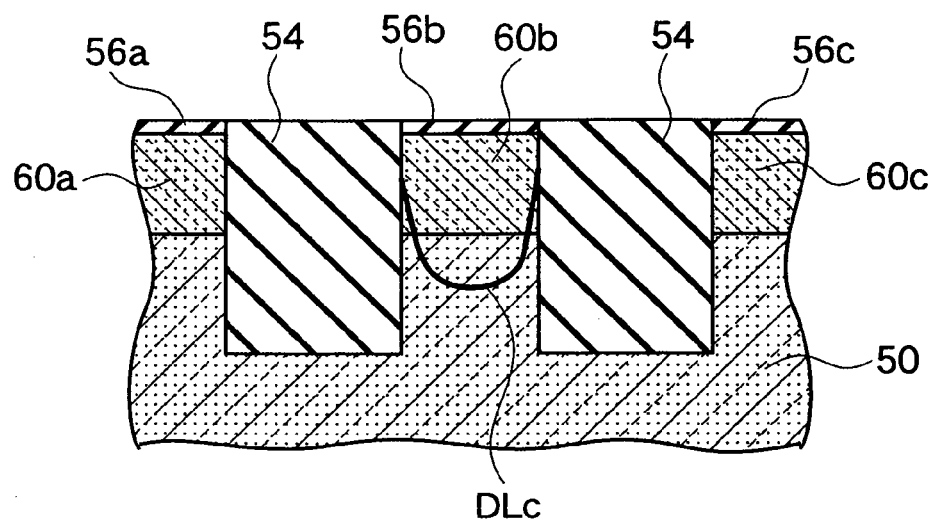
FIG. 17 is a view showing another example of the dislocation line, which is used for explaining the embodiment of the present invention.

For example, if the film thickness To of the insulating film 56 is decreased from about twenty nm to about fourteen nm, the growth of the dislocation is suppressed, and absolutely no dislocation line is generated. Moreover, it is confirmed that the dislocation grows when the film thickness To of the insulating film 56 is about 16 nm or more. For example, when the film thickness To is about 16 nm, as shown in FIG. 16, an analysis dislocation line DLb is generated only in a shallow portion of the active region 60b, which is about 25 nm deep from a surface of the active region 60b below the gate insulating film 56b. The analysis dislocation line DLb generated from one of the top ends in contact with the STIs 54 at both ends of the active region 60b does not extend to a sidewall of the STI 54 on the other side. If the film thickness To is about 18 nm, as shown in FIG. 17, an analysis dislocation line DLc grows to have a length of about 2.00 nm exceeding the active region 60b having a depth Da of 120 nm. Moreover, the analysis dislocation line DLc grows to the sidewalls of the STIs at the both ends of the active region 60b.

Based on the dislocation patterns of the analysis dislocation lines DLa to DLc provided by varying the value of the target structure parameter designated by the structure parameter setting module 18, the process condition determination module 20 predicts a critical value of a structure parameter which causes an electrical characteristic failure. Moreover, the process condition determination module 20 corrects and improves process conditions of the structure parameter which causes a failure based on the results of the stress analysis and the dislocation dynamics analysis.

For example, as a result of the dislocation dynamics analysis, if the film thickness To of the gate insulating films 56a to 56c is about 18 nm or more, the dislocation line grows to exceed the depth Da of the active regions 60a to 60c. Thus, the leakage current in an $n^+p$ junction between the active regions 60a to 60f and the semiconductor substrate 50 could occur.

Actually, a countermeasure lot is manufactured by varying the film thickness of the gate insulating film within a range of about fourteen nm to about twenty nm in the manufacturing tool 42 shown in FIG. 1. In a test pattern of a memory cell in each semiconductor memory of the countermeasure lot, the leakage current of a MOS transistor is measured. As a result, it is confirmed that, if the film thickness of the gate insulating film is about eighteen nm or more, the leakage current failure frequently occurs, and the yield rate is about 30% or less. Moreover, it is confirmed that, if the film thickness of the gate insulating film is about sixteen nm or less, the yield rate is about 90% or more. The process condition determination module 20 corrects the process conditions of the gate thermal oxidation process in such a manner that the film thickness To of the insulating film 56 shown in FIGS. 5 and 6 is set to about fourteen nm to about sixteen nm. The corrected process conditions of the gate thermal oxidation process are transmitted to the manufacturing control server 36.

The input unit 24 may be devices such as a keyboard and a mouse. When an input operation is performed from the input unit 24, corresponding key information is transmitted to the CPU 30. The output unit 26 may be a screen such as a monitor, such as a liquid crystal display (LCD), a light emitting diode (LED) panel, an electroluminescent (EL) panel or the like. The output unit 26 is controlled by the CPU 30. The output unit 26 displays the inspection result acquired from the inspection information input module 2, the shape and structure of the semiconductor device in the manufacturing process acquired from the structure information input module 8, the results of calculations implemented by the stress analysis module 10 and the dislocation dynamics analysis module 14, and the like. The external memory 28 stores programs so that the CPU 30 can implement operations such as simulations executed by the stress analysis module 10 and the dislocation dynamics analysis module 14. Moreover, the internal memory 22 of the CPU 30 or the external memory 28 temporarily stores data obtained during a calculation and an analysis thereof during the operation of the CPU 30.

By use of the system for controlling a manufacturing process according to the embodiment of the present invention, the critical process which causes dislocation generation, and the structure of the critical process which causes an electrical characteristic failure can be identified, and improvement of the manufacturing process can be promptly effected. Thus, a decrease in the yield rate can be prevented and the manufacturing cost can decrease.

In the dislocation dynamics analysis described above, there may be a case where the dislocation grows too greatly in the calculation, even under conditions which actually do not generate the dislocation. In the vicinity of a dislocation origin of such an erroneous dislocation growth, a stress predicted by the stress analysis is abnormally increased. For example, a stress field is recalculated by correcting a viscosity coefficient of the insulating film on the erroneous dislocation origin. Accordingly, the calculation is improved so as to allow the analysis dislocation line to match the inspected dislocation image measured by the TEM. As described above, in the system for controlling a manufacturing process according to the embodiment of the present invention, by repeating verifications using the inspection information, it is possible to provide a prediction of the analysis dislocation line with a high precision level.

Moreover, in the above description, a single structure parameter which causes a failure is used. However, a plurality of structure parameters may be used. For example, if the film thickness To of the gate insulating films 56a to 56c is about eighteen nm or more, the dislocation increases to exceed the depth Da of the active regions 60a to 60c. As another structure parameter, the gate length Lg of the gate electrode 58 is varied, for example, from about ninety nm to about eighty nm, in order to implement the stress analysis and the dislocation dynamics analysis. As a result, growth of the dislocation is suppressed and limited to about fifty nm or less. In a MOS transistor manufactured for a prototype in the manufacturing tool 42 shown in FIG. 1, in which the gate length Lg of the gate electrode 58 is set to about eighty nm, the yield rate is improved to about 95%.

Figure 18:
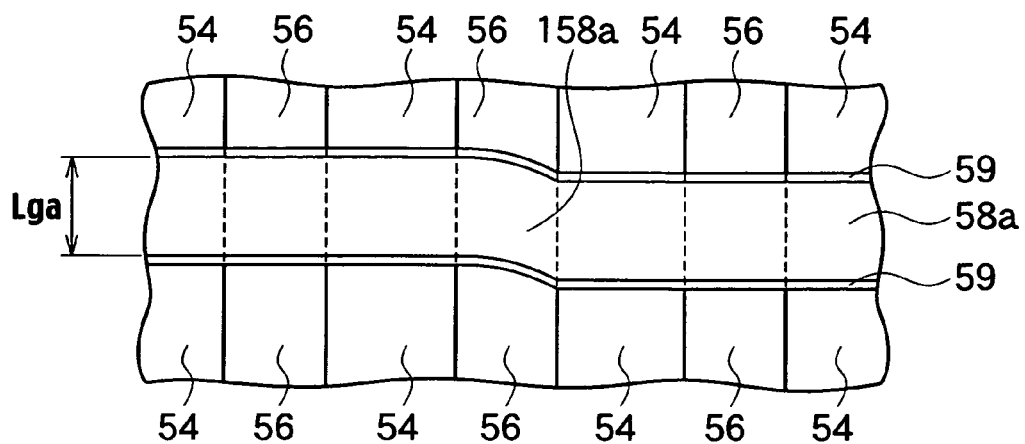
FIG. 18 is a plan view showing an example of a semiconductor device, which is used for explaining the embodiment of the present invention.
Figure 19:
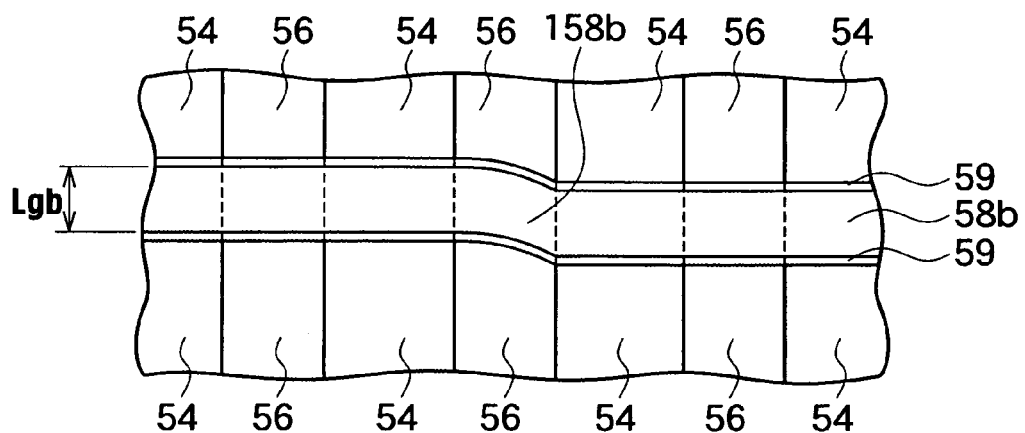
FIG. 19 is a plan view showing another example of the semiconductor device, which is used for explaining the embodiment of the present invention.
Figure 20:
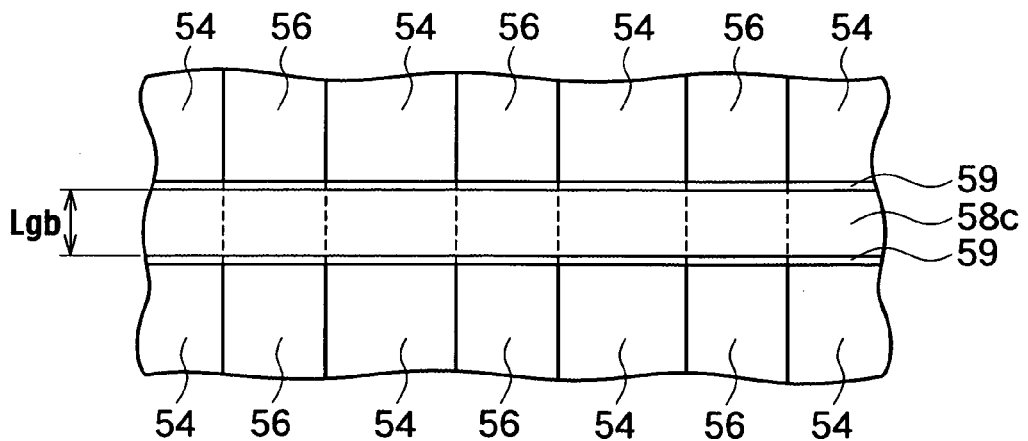
FIG. 20 is a plan view showing another example of the semiconductor device, which is used for explaining the embodiment of the present invention.

Moreover, as shown in FIG. 18, stress concentration occurs in a curved portion 158a of the gate electrode 58a in which a gate electrode 58a is on a boundary between the insulating film 56 and the STI 54. For example, the stress analysis and the dislocation dynamics analysis are implemented for the curved portion 158a of the gate electrode 58a which has a gate length Lga of about ninety nm. If the film thickness To of the gate insulating films 56a to 56c is about twenty nm, as shown in FIG. 19, a gate length Lgb of a gate electrode 58b may be as short as about eighty nm. Furthermore, as shown in FIG. 20, a shape of a curved portion 158b of the gate electrode 58b is changed to a linear shape of a gate electrode 58c. As a result, growth of the dislocation is suppressed, and a depth thereof is limited to about eighty nm or less. In a MOS transistor manufactured for a prototype by manufacturing a photomask corresponding to the gate electrode 58c in the design tool 41 shown in FIG. 1, it is confirmed that the yield rate is improved to about 72%.

As described above, the stress analysis and the dislocation dynamics analysis are applied by combining the plurality of structure parameters of the structure of the semiconductor substrate 50 processed by a critical process. Thus, the process conditions for the respective structure parameters can be corrected and improved.

A method for controlling a manufacturing process according to the embodiment of the present invention will be described with reference to flowcharts shown in FIGS. 21 and 22.

The design control server 35 shown in FIG. 1, manufactures a photomask in the design tool 41 based on layout data of a semiconductor device stored in the design information database 31. The manufacturing control server 36 controls manufacture of the semiconductor device for a prototype in the manufacturing tool 42 based on process conditions stored in the manufacturing information database 32. By use of manufacturing apparatuses, a circuit pattern of the photomask is transferred onto a semiconductor substrate through a plurality of manufacturing processes. A shape and structure parameters of the semiconductor device, which is formed in the respective manufacturing processes, are stored in the manufacturing information database 32 as structure information.

The semiconductor device manufactured for a prototype is measured for electrical characteristics by the inspection tool 44. For a semiconductor device in which a failure caused by leakage current in a pn junction is detected, a dislocation image is inspected by use of the TEM. Inspection information such as a failure of the electrical characteristic of the semiconductor device and the inspected dislocation image are stored in the inspection information database 34 by the inspection server 38.

Figure 21:
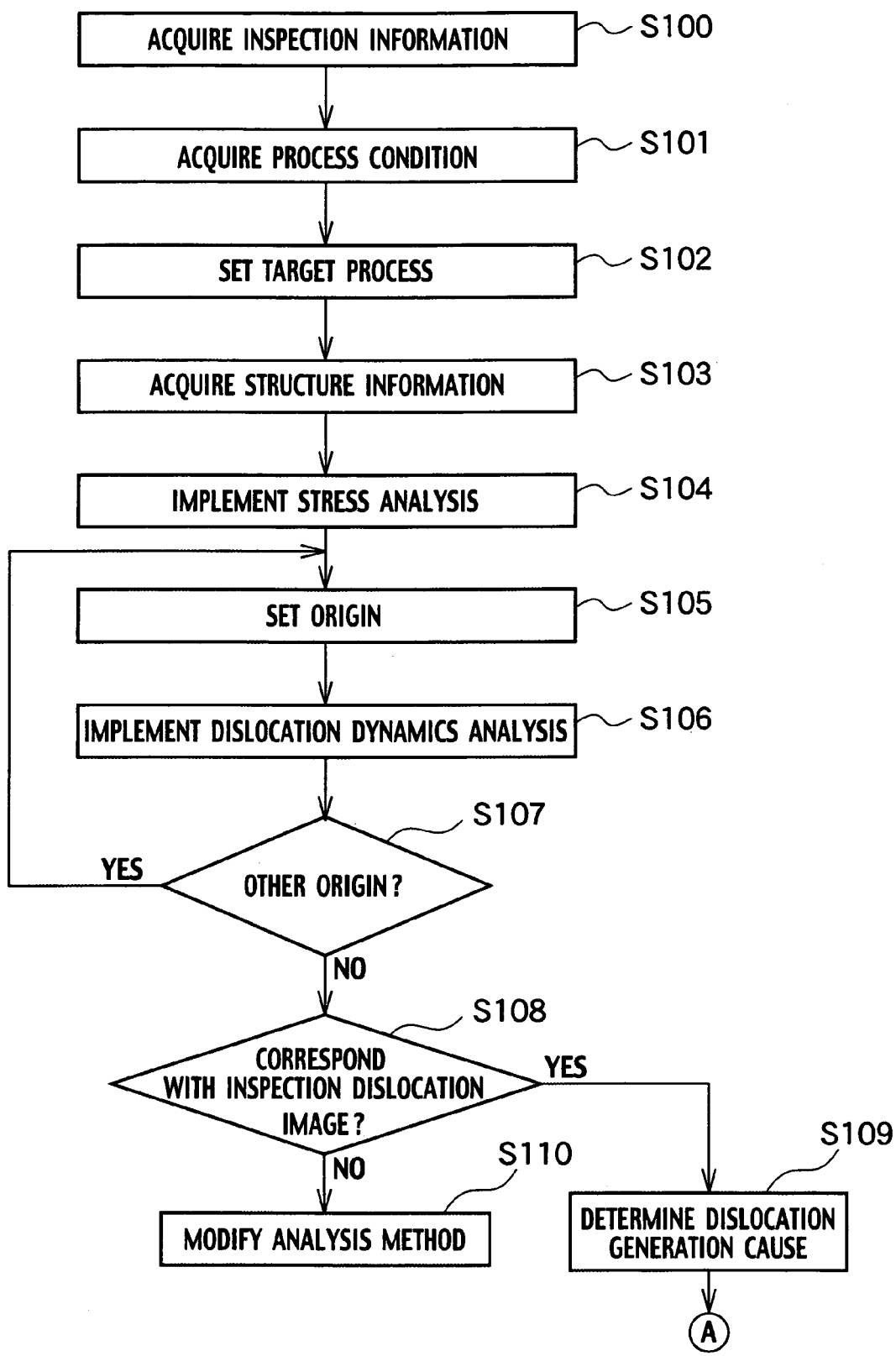
FIGS. 21 to 22 are flowcharts showing an example of a method for controlling a manufacturing process according to the embodiment of the present invention.

In Step S100 shown in FIG. 21, the inspection information input module 2 of the CPU 30 shown in FIG. 1 searches for a defective semiconductor device in which a failure caused by the leakage current in the pn junction is detected, as stored in the inspection information database 34. The inspection information input module 2 acquires the inspected dislocation image of the searched defective semiconductor device from the inspection information database 34.

In Step S101, the process condition input module 4 acquires a plurality of processes and process conditions of the defective semiconductor device from the manufacturing information database 32. In Step S102, the process setting module 6 selects a manufacturing process including heat treatment as a target process for analyzing a cause of dislocation generation from among the plurality of processes. Moreover, in Step S103, the structure information input module 8 acquires, from the manufacturing information database 32, structure information such as structure parameters which specify the structure of the semiconductor substrate 50 to be processed by the target manufacturing process.

In Step S104, based on process conditions of the target process and the structure of the semiconductor substrate 50 processed by the target process, the stress analysis module 10 performs a three-dimensional stress simulation to predict a stress field by calculating stresses at a plurality of nodes provided in the structure of the semiconductor substrate 50.

In Step S105, the origin setting module 12 sets a plurality of origins at positions where stresses of a reference value or values greater than the reference value are concentrated in the predicted stress field. Among the plurality of origins, an origin at which a source of a dislocation occurs is selected. In Step S106, for the origin at which the source of dislocation occurs, the dislocation dynamics analysis module 14 implements a dislocation dynamics simulation to calculate a growth process of the dislocation in the stress field so as to predict a dislocation pattern of an analysis dislocation line. In Step S107, until growth processes for all of the origins are calculated by the dislocation dynamics simulation, the processing of Steps S105 and S106 is repeated.

In Step S108, the dislocation pattern comparison module 16 compares the dislocation pattern of the analysis dislocation line with the inspected dislocation image. As a result of the comparison, if the dislocation origin and a length of the dislocation line of the analysis dislocation line corresponds to the inspected dislocation image within a range of determination reference values previously set in the dislocation pattern comparison module 16, it is determined in Step S109 that the target process is a critical process which causes the generation of a dislocation. Moreover, if the dislocation pattern of the analysis dislocation line does not correspond with the inspected dislocation image in Step S108, the stress simulation of the stress analysis is improved, for example by correcting a viscosity of an insulating film on an erroneous dislocation origin, in Step S110.

Figure 22:
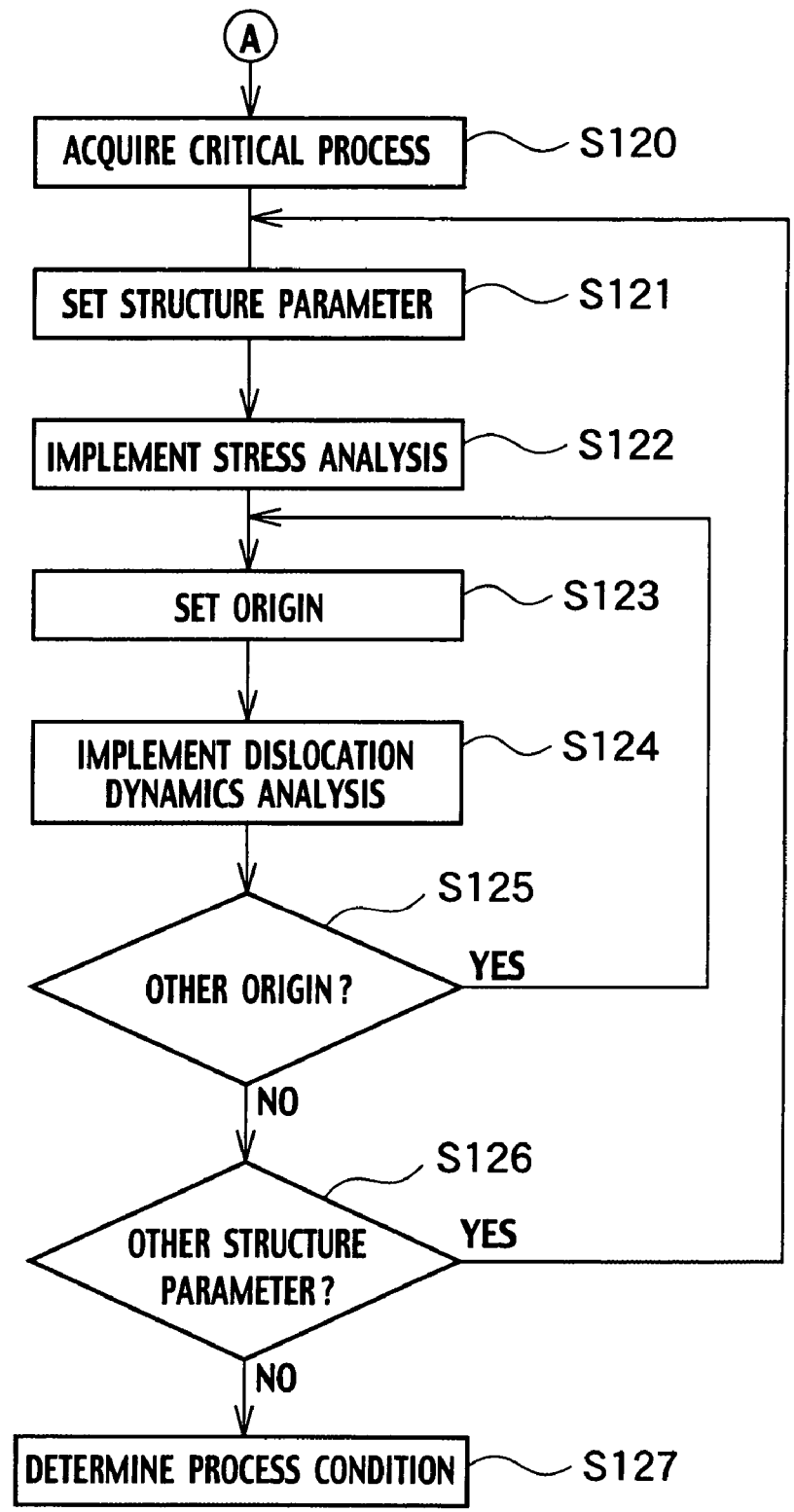

In Step S120 of FIG. 22, the process setting module 6 acquires the critical process, which is determined to be the reason for generation of a dislocation, as a target process. In Step S121, the structure parameter setting module 18 provides a target structure parameter from among a plurality of structure parameters which specify the structure of the semiconductor substrate 50 processed by the target process. A plurality of different values are applied to the target structure parameters.

In Step S122, the stress analysis module 10 predicts a plurality of stress fields for the respective values of the plurality of target structure parameters by a processing similar to the processing of Step S104 in FIG. 21. In Steps S123 and S124, the origin setting module 12 and the dislocation dynamics analysis module 14 calculate growth of dislocations and for all origins provided in the plurality of stress fields so as to predict dislocation patterns of analysis dislocation lines, respectively, similar to the case of Steps S105 and S106. In Step S126, until growth of dislocations are calculated by dislocation dynamics analysis for all the set structure parameters, the processing of Steps S121 to S125 is repeated.

In Step S127, based on another dislocation pattern of the analysis dislocation line obtained by varying the value of the target structure parameter specified by the structure parameter setting module 18, the process condition determination module 20 predicts a critical value of a structure parameter which causes an electrical characteristic failure. Moreover, based on results of the stress analysis and the dislocation dynamics analysis, the process condition determination module 20 corrects and improves process conditions of a manufacturing process corresponding to the structure parameter which causes a failure.

By use of the method for controlling a manufacturing process according to the embodiment of the present invention, it is possible to efficiently determine a critical process relating to an, electrical characteristic failure induced by dislocation of a semiconductor device manufactured for a prototype of product under development and a critical dislocation origin. Furthermore, the stress analysis and the dislocation dynamics analysis are applied to each of the plurality of structure parameters of the structure of the semiconductor substrate 50 processed by the critical process. Thus, the process conditions for the structure parameter which causes a failure can be improved.

Other Embodiments

In the embodiment of the present invention, a description has been based on a semiconductor memory, which includes a memory unit of a MOS transistor, as the semiconductor device. However, semiconductor memories such as a flash memory using a floating gate MOS transistor, a static random access memory (SRAM) using a flip-flop circuit, a dynamic RAM (DRAM) using a combination of a capacitor and a MOS transistor may be used. Moreover, a mixed memory logic device, a logic device or the like, may be used. Moreover, as the target process, not only a manufacturing process for the MOS transistor, a manufacturing process for an insulated gate transistor (MIS transistor) having various gate insulating films other than a $SiO_2$ film, a bipolar transistor (BPT), or an element to form a pn junction in a semiconductor substrate such as a pn junction diode, is contemplated.

Moreover, in the description of the embodiment of the present invention, the process including heat treatment is disclosed as the candidate for the critical process which causes dislocation. However, stresses may be generated even in the dry etching process or in a process involving a change in shape of the semiconductor substrate such as the CVD process. When the process involving the change in shape of the semiconductor substrate is treated as the candidate for the critical process, a process simulator combining a shape simulation and the three-dimensional stress simulation may be used as the stress analysis module 10. Thus, the stress field can be easily predicted.

Moreover, in the embodiment of the present invention, a trial manufacture of the semiconductor device has been described. However, even when a similar problem of a failure of an electrical characteristic arises in mass production, an enormous amount of experiments and failure analyses executed in the current measures to prevent failures are not required. The problematic critical process, the process causing a failure and the like can be pinpointed or can be specified within a limited range. Thus, improvement in processes can be easily achieved.

Furthermore, a semiconductor device in a developmental stage, in which an actual dislocation has not yet been found, does not include a sufficient amount of inspection information of an inspected dislocation image, and is inaccurate for comparison with a dislocation pattern of an analysis dislocation line. However, in a semiconductor device product with a 70 nm design rule, which is close to the above-described semiconductor device with the 90 nm design rule, the inspection information and the manufacturing information of the 90 nm design rule can be used. Based on the critical process and the critical dislocation origin, which are determined according to the 90 nm design rule, the stress field and the growth process of the dislocation can be predicted by implementing the stress analysis and the dislocation dynamics analysis. Therefore, measures can be taken to prevent a process from causing a failure.

By implementing the stress analysis and the dislocation dynamics analysis using the semiconductor device with the 90 nm design rule, a semiconductor device based on the 70 nm design rule is manufactured for a prototype. As a result, it can be confirmed that there is nothing wrong with operations of the semiconductor device, and dislocations are not found by TEM observation. Furthermore, also in development of a semiconductor device with a design rule of 70 nm or less, for example, 55 nm or less, the method for controlling a manufacturing process according to the embodiment of the present invention can be applied to predict a critical manufacturing process, a manufacturing process creating a failure, and the like.

Various modifications will become possible for those skilled in the art after storing the teachings of the present disclosure without departing from the scope thereof.

What is claimed is:

1. A control system for a plurality of manufacturing processes, comprising:
    an inspection tool configured to inspect a dislocation image of a dislocation generated in a semiconductor substrate processed by a plurality of manufacturing processes;
    an inspection information input module configured to acquire the inspected dislocation image;
    a process condition input module configured to acquire a plurality of process conditions of the manufacturing processes;
    a structure information input module configured to acquire a structure of the semiconductor substrate processed by a target manufacturing process;

a stress analysis module configured to calculate stresses at a plurality of nodes provided in the structure, based on a target process condition of the target manufacturing process and the structure;

an origin setting module configured to provide a plurality of origins at positions where a stress concentration having a stress value not less than a reference value is predicted;

a dislocation dynamics analysis module configured to calculate a dislocation pattern of an analysis dislocation line in a stress field by the stresses for each position of the origins; and a dislocation pattern comparison module configured to compare the dislocation pattern of the analysis dislocation line with the inspected dislocation image so as to determine whether the target manufacturing process is a critical manufacturing process that generates the dislocation.

2. The control system of claim 1, further comprising:

a structure parameter setting module configured to select a target structure parameter from among a plurality of structure parameters, the structure parameters specifying the structure processed by the critical manufacturing process; and a process condition determination module configured to predict a critical value of the target structure parameter causing a failure based on another dislocation pattern of another analysis dislocation line provided by varying a value of the target structure parameter, so as to correct a critical process condition of the critical manufacturing process corresponding to the target structure parameter.

3. The control system of claim 1, further comprising:

an inspection information database configured to store inspection information including the inspected dislocation image; and a manufacturing information database configured to store manufacturing information including the process conditions and the structure parameters.

4. The control system of claim 1, wherein the target manufacturing process includes a heat treatment.

5. The control system of claim 1, wherein the target manufacturing process involves a change in a shape of the semiconductor substrate.

6. The control system of claim 1, wherein each of the stresses is a shearing stress in twelve slip systems defined by three slip directions in four slip planes of the semiconductor substrate.

7. The control system of claim 1, wherein the dislocation pattern includes an end position and a dislocation length of the analysis dislocation line.

8. A computer implemented method for controlling a plurality of manufacturing processes, comprising:

inspecting a dislocation image of a dislocation in a semiconductor substrate processed by a plurality of manufacturing processes;

acquiring a plurality of process conditions of the manufacturing processes;

acquiring a structure of the semiconductor substrate processed by a target manufacturing process;

calculating stresses at a plurality of nodes provided in the structure based on a target process condition of the target manufacturing process and the structure;

providing a plurality of origins at positions where a stress concentration having a stress value not less than a reference value is predicted;

calculating a growth process of an analysis dislocation line in a stress field by the stresses for each position of the origins so as to predict a dislocation pattern of the analysis dislocation line;

comparing the dislocation pattern of the analysis dislocation line with the inspected dislocation image; and determining, based on the comparison of the dislocation pattern of the analysis dislocation line with the inspected dislocation image, whether the target process is a critical manufacturing process that generates the dislocation.

9. The method of claim 8, wherein the inspected dislocation image is measured for a semiconductor device manufactured on the semiconductor substrate in which an electrical characteristic failure is detected.

10. The method of claim 9, wherein the electric characteristic failure is a leakage current in a pn junction of the semiconductor device.

11. The method of claim 8, further comprising:

selecting a target structure parameter from among a plurality of structure parameters, the structure parameters specifying the structure processed by the critical manufacturing process; and predicting a critical value of the target structure parameter which causes a failure based on a second dislocation pattern of a second analysis dislocation line provided by varying a value of the target structure parameter, so as to correct a critical process condition of the critical manufacturing process corresponding to the target structure parameter.

12. The method of claim 8, wherein the target manufacturing process includes a heat treatment.

13. The method of claim 8, wherein the target manufacturing process includes a change in a shape of the semiconductor substrate.

14. The method of claim 8, wherein each of the stresses is a shearing stress in twelve slip systems defined by three slip directions in four slip planes of the semiconductor substrate.

15. The method of claim 8, wherein the dislocation pattern includes an end position and a dislocation length of the analysis dislocation line.

16. A method for manufacturing a semiconductor device, comprising:

performing a plurality of manufacturing processes on a semiconductor substrate;

inspecting a dislocation image of a dislocation in the semiconductor substrate;

creating a corrected target process condition by processing includes:

acquiring the inspected dislocation image;

acquiring a plurality of process conditions of the manufacturing processes;

acquiring a structure of the semiconductor substrate processed by a target manufacturing process;

calculating stresses at a plurality of nodes provided in the structure based on a target process condition of the target manufacturing process and the structure;

providing a plurality of origins at positions where a stress concentration having a stress value not less than a reference value is predicted;

calculating a dislocation pattern of an analysis dislocation line in a stress field by the stresses for each position of the origins;

comparing the dislocation pattern of the analysis dislocation line with the inspected dislocation image so as to determine whether the target process is a critical manufacturing process that generates the dislocation in the semiconductor substrate;

selecting a target structure parameter from among a plurality of structure parameters, the structure parameters specifying the structure processed by the critical manufacturing process; and predicting a critical value of the target structure parameter which causes a failure based on a second dislocation pattern of a second analysis dislocation line provided by varying a value of the target structure parameter, so as to correct a critical process condition of the critical manufacturing process; and performing the target manufacturing process on another semiconductor substrate by the corrected target process condition.

17. The method of claim 16, wherein the inspected dislocation image is measured for the semiconductor device in which an electrical characteristic failure is detected.

18. The method of claim 17, wherein the electric characteristic failure is a leakage current in a pn junction in the semiconductor substrate.

19. The method of claim 16, wherein the target manufacturing process includes a heat treatment.

20. The method of claim 16, wherein the target manufacturing process includes a change in a shape of the semiconductor substrate.

* * * * *